(12) United States Patent
Bodano et al.

(10) Patent No.: US 7,504,868 B2
(45) Date of Patent: Mar. 17, 2009

(54) HIGH-SIDE SWITCH WITH A ZERO-CROSSING DETECTOR

(75) Inventors: Emanuele Bodano, Padua (IT); Marco Flaibani, Udine (IT); Cristian Garbossa, Bressanone (IT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/724,610

(22) Filed: Mar. 15, 2007

(65) Prior Publication Data

US 2008/0224738 A1    Sep. 18, 2008

(51) Int. Cl.
    *H03K 3/00*    (2006.01)
(52) U.S. Cl. .................. 327/108; 327/109; 327/387; 323/282; 323/284; 363/21.01; 363/21.03
(58) Field of Classification Search ......... 327/108–110, 327/379, 381, 384, 387, 388; 323/282–285; 326/82–87; 363/21.01, 21.03, 21.05, 21.1, 363/21.3, 21.18
    See application file for complete search history.

(56) References Cited

U.S. PATENT DOCUMENTS

| | | | |
|---|---|---|---|
| 4,498,021 A | 2/1985 | Uya | |
| 5,225,687 A | 7/1993 | Jason | |
| 5,754,065 A | 5/1998 | Wong | |
| 6,674,268 B2 * | 1/2004 | Rutter et al. | ................. 323/224 |
| 6,982,574 B2 * | 1/2006 | Harriman et al. | ............ 327/108 |
| 2004/0100240 A1 | 5/2004 | Natsume et al. | |

* cited by examiner

*Primary Examiner*—An T Luu
*Assistant Examiner*—An T. Luu
(74) *Attorney, Agent, or Firm*—Maginot, Moore & Beck

(57) ABSTRACT

A circuit arrangement comprising a high-side semiconductor switch with a first load terminal connected to a first supply terminal receiving an input voltage, a second load terminal connected to an output terminal providing an output signal, and a control terminal, a floating driver circuit connected to the control terminal for driving the semiconductor switch, a level shifter receiving an input signal and providing a floating input signal dependent on the input signal, a floating control logic receiving the output signal and the floating input signal and providing at least one control signal to the floating driver circuit, wherein the floating control logic comprises means for detecting an edge in the output signal and means for generating the control signal dependent on the result of the edge detection.

20 Claims, 8 Drawing Sheets

HIGH-SIDE SWITCH WITH A ZERO-CROSSING DETECTOR

TECHNICAL FIELD

The current invention relates to a high-side switch comprising a zero-crossing detector for detecting a change in the switching state of a high-side switch and for controlling the switching operation itself.

BACKGROUND

In high-side semiconductor switches information about the switching state of the high-side switch is often needed to take opportune actions. This information is usually given by a zero-crossing detector which usually is a comparator comparing the potential of a switching node, the source of a MOS transistor, for example, to a reference potential, thus detecting a rising or a falling edge of the switching node.

To give an example, the information when the switching node has actually changed its potential from a low level to a high level may be used for controlling the gate-voltage of a MOS high-side switch in order to reduce conducted electromagnetic emission thus improving electromagnetic compatibility (EMC).

The high-side switch is usually controlled by a floating logic and driver circuit which is supplied by a floating power supply, whereas the zero-crossing detector is usually supplied by a ground related supply voltage. Since the voltages to be switched by the high-side switch can be rather high for an ordinary (CMOS) comparator, the inputs of the comparator have to be especially designed for high voltages. Furthermore, the output of the zero-crossing detector also provides a ground related signal as its output signal which has to be level shifted by an extra level shifter, before it can be further processed by the floating logic controlling the actual switching state of the high-side switch. The additional level shifter has adverse effects on the processing speed of the output signal of the zero-crossing detector, i.e., the output signal is delayed by the level shifter before it can be further processed by the high-side logic.

For an optimal switching operation it is necessary, to detect zero-crossings (i.e., a rising edge) of the signal provided by the switching node as fast as possible.

There is a general need to provide a circuit arrangement comprising a high-side semiconductor switch, a floating driver circuit, and a floating control logic which is able to detect zero-crossings in the signal provided by the switching node very fast and which allows to eliminate the need for a high voltage comparator.

SUMMARY

At least one embodiment of the invention involves "transferring" the zero-crossing detection into the floating control logic controlling a switching state of the high-side switch. This yields double benefit: On the one hand the zero-crossing detector does not require a high voltage comparator and a second level shifter, and on the other hand the delay time is reduced, because a level shifting of the output signal of the zero-crossing detector is dispensable.

A first embodiment of the inventive circuit arrangement comprises a high-side semiconductor switch with a first load terminal connected to a first supply terminal receiving an input voltage, a second load terminal connected to an output terminal providing an output signal, and a control terminal. It further comprises a floating driver circuit connected to the control terminal for driving the semiconductor switch, a level shifter receiving an input signal and providing a floating input signal dependent on the input signal, and a floating control logic receiving the output signal and the floating input signal and providing at least one control signal to the floating driver circuit. The floating control logic comprises means for detecting an edge in the output signal and means for generating the control signal dependent on the result of the edge detection.

In one embodiment of the invention the means for detecting an edge in the output signal can comprise a series circuit of a capacitor and a resistor connected between the first supply terminal and the output terminal, a comparator whose first input terminal is connected with the common node of the capacitor and the resistor, and a reference voltage source connected between a second input terminal of the comparator and the output terminal. Instead of an extra capacitor, the drain-gate capacitance or the gate-source capacitance of a MOS transistor can be used to facilitate the integration into one single chip.

The comparator is connected to the means for generating the control signal. One or more control signals control the operation of the driver circuit which, in another embodiment of the invention, can be adapted for providing a constant current to the control terminal of the semiconductor switch before an edge in the output signal is detected, whereas the driver circuit is adapted for providing a constant potential to the control terminal of the semiconductor switch after an edge in the output signal has been detected.

In a further embodiment the circuit arrangement further comprises a further a high-side semiconductor switch with a first load terminal connected to the first supply terminal, a second load terminal connected to the output terminal, and a control terminal. A further floating driver circuit is connected to the control terminal of the further high-side semiconductor switch for driving the further semiconductor switch, wherein the floating control logic is adapted for providing at least one control signal to each of the floating driver circuits. In essence there are (in this embodiment) two high-side semiconductor switches which are connected in parallel, but driven by two different floating driver circuits. These driver circuits are both controlled by the floating driver logic which comprises means for detecting an edge in the output signal and means for generating the control signals (for the floating drivers) dependent on the result of the edge detection.

The circuit arrangement can further comprise a bootstrap circuit connected to the output terminal and providing a bootstrap supply voltage at a third supply terminal to the floating driver circuit and the floating control logic. Thus a floating supply voltage is provided to the floating control logic, the floating driver circuit, and all other floating circuit components.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
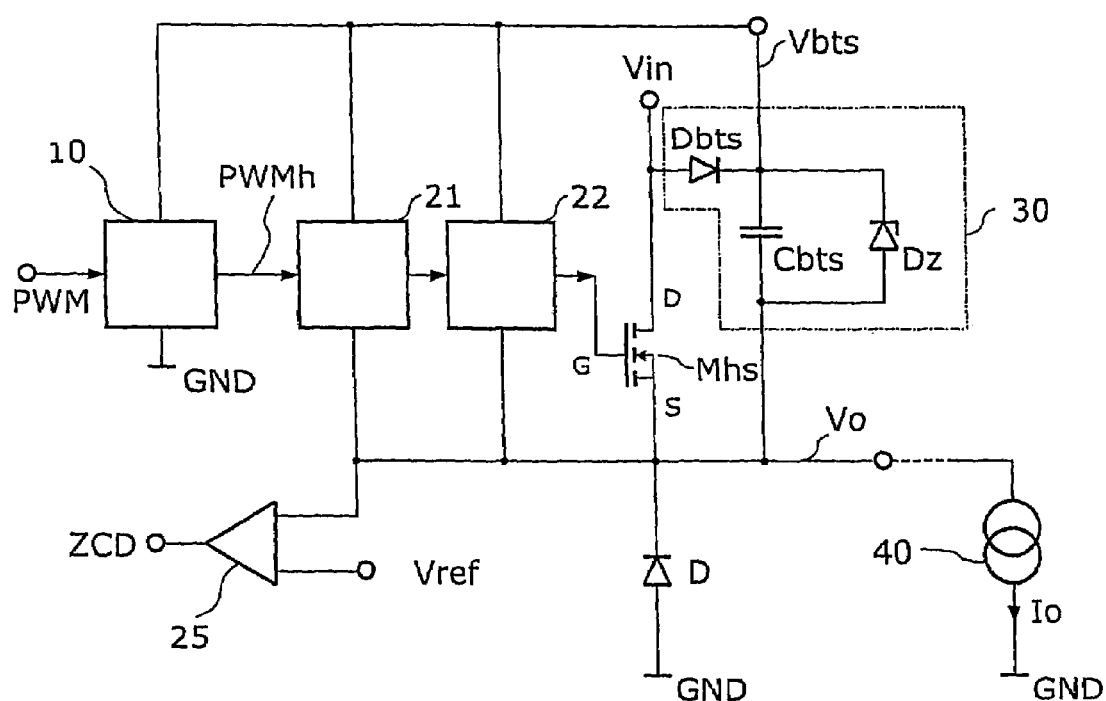
FIG. 1 shows a conventional circuit arrangement comprising a high-side semiconductor switch, a floating driver circuit, a floating control logic, a level shifter, and a zero-crossing detector with a ground related power supply.

FIG. 1 illustrates a conventional circuit arrangement comprising a high-side switch Mhs which is, in the shown example, a n-MOSFET. The high-side switch Mhs has a first load terminal (drain terminal D) connected to a first supply terminal receiving an input voltage Vin, a second load terminal (source terminal S) connected to an output terminal providing an output signal Vo (equal to the source voltage of the high-side switch Mhs), and a control terminal (gate terminal G).

For driving the high-side switch the circuit arrangement further comprises a floating driver circuit 22 connected to the gate terminal G for driving the semiconductor switch Mhs. The driver circuit itself is controlled by a floating control logic 21 which provides at least one floating control signal CTRL to the floating driver circuit 22 and receives a floating input signal PWMh.

The floating input signal is provided by a level shifter 10 receiving an input signal PWM which is related to a constant (e.g., ground) potential and providing a floating input signal which depends on the ground-related input signal PWM. In many cases the floating input signal PWMh is just a level shifted version of the ground-related input signal PWM.

The floating control logic 21 and the floating driver circuit 22 are supplied by a floating power supply, i.e., all floating components are connected to a third supply terminal providing a bootstrap supply voltage Vbts which is not related to ground potential, but to the output signal Vo.

The load is presented by a current source 40 loading the circuit arrangement with a load current Io. A free-wheeling diode D is necessary to provide a current path in the case the high-side switch Mhs is in an off-state.

A bootstrap supply circuit 30 is connected to the output terminal, thus receiving the output signal Vo. It provides a bootstrap supply voltage Vbts at a third supply terminal to all floating circuit components, especially to the floating control logic 21, the floating driver circuit and the level shifter 10. There are many known ways to implement a bootstrap supply; one simple is shown here for the sake of completeness. A bootstrap capacitor Cbts is connected between the output terminal (providing Vo) and the third supply terminal providing the bootstrap supply voltage Vbts with respect to the output signal Vo. A bootstrap diode Dbts is connected between the first supply terminal (providing Vin) and the third supply terminal (providing Vbts) such, that the bootstrap capacitor Cbts is charged via the bootstrap diode Dbts during a time-span the output signal Vo is at a low level. When the output signal Vo is at a high level discharging of the bootstrap capacitor Cbts is inhibited by the bootstrap diode Dbts. A zener diode Dz can be connected in parallel to the bootstrap capacitor Cbts to limit the bootstrap supply voltage to the zener voltage of the zener diode Dz.

For detecting an edge in the output signal Vo, the circuit arrangement further comprises a zero-crossing detector 25 receiving the output signal Vo at a first input terminal and a reference potential Vref at a second input terminal. A zero-crossing signal ZCD is provided at an output terminal of the zero-crossing detector 25. The zero-crossing signal ZCD assumes a first logic level (e.g. a low level) if the output signal Vo is smaller than the reference potential Vref and a second logic level (e.g. a high level) if the output signal Vo is higher than the reference potential Vref. The zero-crossing signal ZCD has to be evaluated by the floating control logic in order to optimize the switching operation. Therefore the zero-crossing signal ZCD has to be level shifted and the level shifted version has to be provided to the floating control logic (not shown).

The level shifting of the zero-crossing signal ZCD introduces a significant delay in the signal path, what is disadvantageous for an optimal control of the switching. Since the zero-crossing detector 25 is supplied by a ground related power supply its inputs have to sustain a voltage as high as the input voltage Vin which can be several hundred volts.

Figure 2:
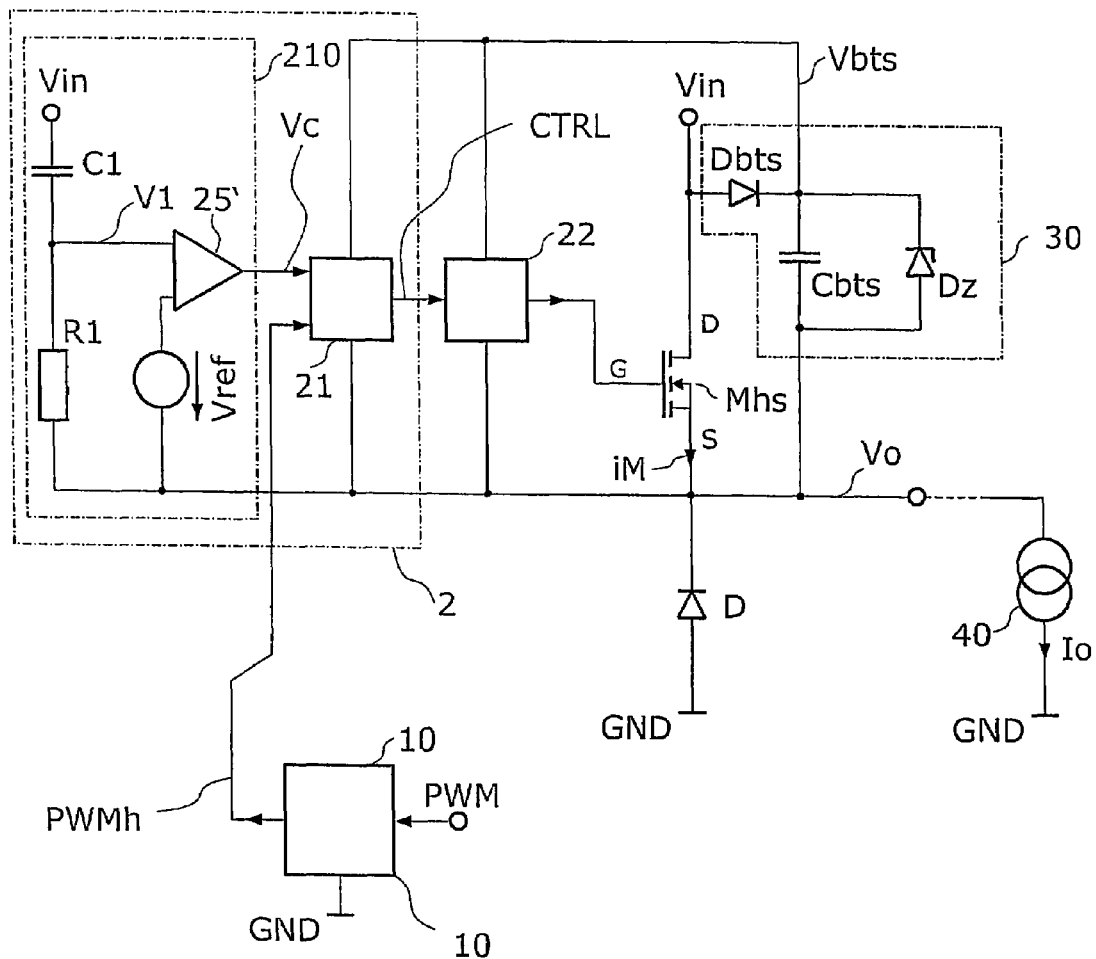
FIG. 2 shows a first embodiment of the invention comprising a high-side semiconductor switch, a floating driver logic, and a floating control logic comprising means for detecting an edge in the output signal and means for generating at least one control signal dependent on the result of the edge detection.

In one embodiment of the invention, shown in FIG. 2, the edge detection in the output signal Vo (i.e., the zero-crossing detector) has been "transferred" to the floating control logic 2. Like the circuit shown in FIG. 1 the embodiment of FIG. 2 comprises a high-side semiconductor switch Mhs which is, in the shown example, a n-MOSFET with a drain terminal D connected to a first power supply terminal receiving an input voltage Vin, a source terminal S connected to an output terminal providing an output voltage V0, and a gate terminal G. The embodiment further comprises a floating driver circuit 22 connected to the gate terminal G of the semiconductor switch Mhs, a level shifter receiving an input signal PWM and providing a floating input signal PWMh dependent on the input signal PWM, and a floating control logic 2 receiving the output signal Vo and the floating input signal PWMh and providing at least one control signal CTRL to the floating driver circuit 22. The floating control logic 2 comprises means (25', V1, C1, R1) for detecting an edge in the output signal Vo and means 21 for generating the control signal CTRL dependent on the result of the edge detection.

The means for detecting an edge in the output signal comprise a series circuit of a capacitor C1 and a resistor R1 connected between the first supply terminal (providing Vin) and the output terminal (providing Vo), a floating comparator 25', whose first input terminal is connected with the common node of the capacitor C1 and the resistor R1, and a reference voltage source Vref connected between a second input of the comparator 25' and the output terminal. The potential of the common node of the capacitor C1 and the resistor R1 is labelled V1, the comparator output signal of the comparator 25' is labelled Vc. The control signal CTRL is generated dependent on the comparator output signal Vc and the floating input signal PWMh is provided by the level shifter 10.

All floating components are supplied by a bootstrap supply voltage as already explained with respect to the circuit shown in FIG. 1.

An edge in the output signal Vo is signalled by the comparator output signal Vc of the comparator 25'. The function of the edge detection (i.e., the function of the means for detecting an edge in the output signal) is best explained with the help of the timing diagrams shown in FIG. 3.

Figure 3:
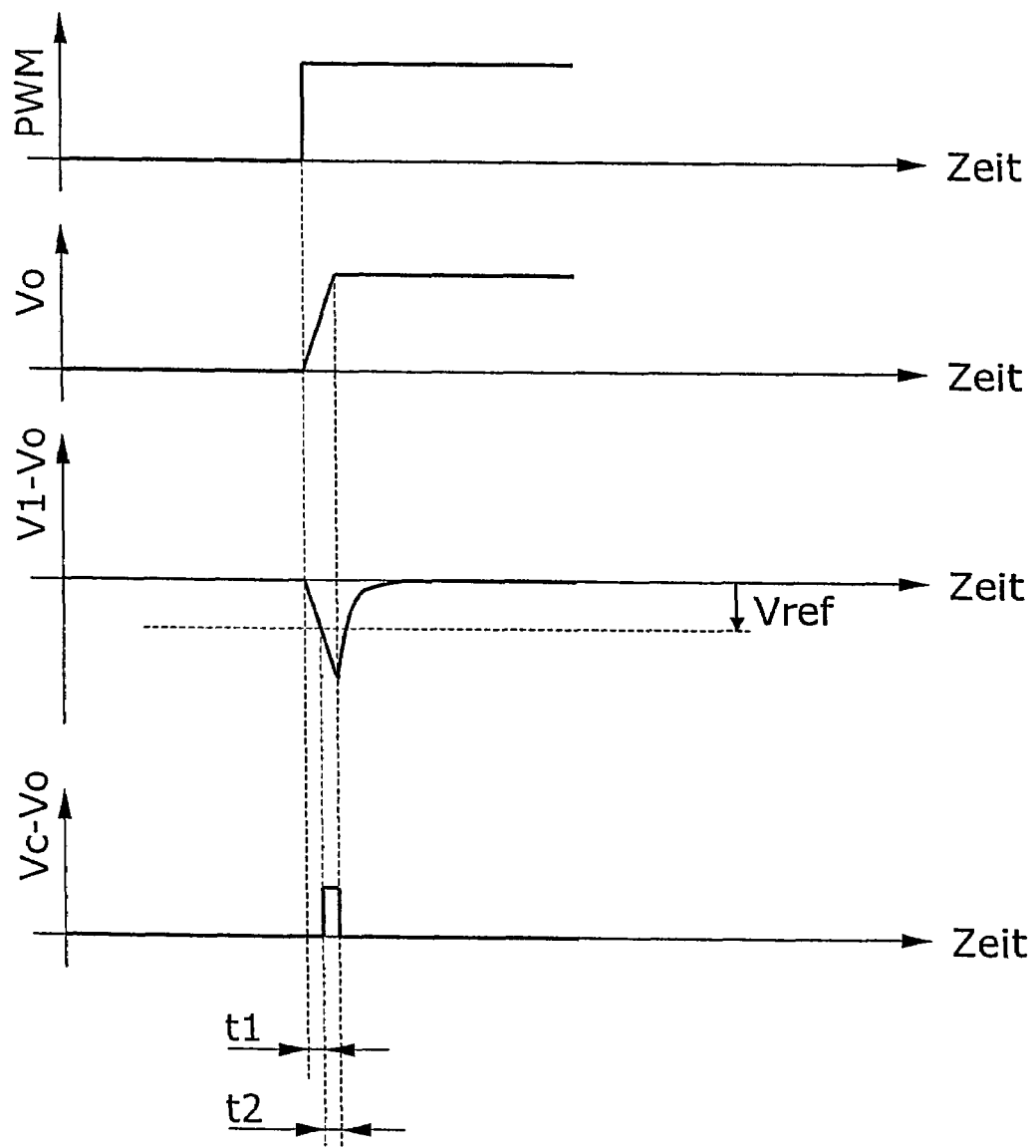
FIG. 3 shows the timing diagrams of several signals within the floating control logic shown in FIG. 2.

FIG. 3 shows timing diagrams of the input signal PWM, the output signal Vo, the potential V1 of the common node of capacitor C1 and resistor R1, and timing diagram of the comparator output signal Vc of the comparator 25'. The potential V1 and the comparator output signal Vc are measured with respect to the output signal Vo, therefore the differences V1–Vo and Vc–Vo are depicted in FIG. 3 instead of absolute (i.e., ground-related) values.

The first timing diagram shows a rising edge in the input signal PMW signalling, that the high-side switch has to be switched to an on-state. Consequently, the semiconductor switch Mhs is switched on via the level shifter 10, the floating control logic 2 and the floating driver circuit 22 (details are explained later) and the output voltage V0 rises from a value close to zero (i.e., ground potential) to a value close to the input voltage Vin.

The capacitor C1 is charged via the resistor R1 during a period, when the output signal Vo is at a low level, i.e., at a voltage level close to (or below) zero. Directly before the rising edge in the input signal PWM and the output signal Vo the voltage drop over the capacitor C1 is approximately equal to the input voltage Vin. Since the voltage drop over the capacitor C1 can not change as rapidly as the voltage level of the output signal Vo, the potential V1 of the common node of resistor R1 and capacitor C1 remains approximately constant (with respect to ground potential) during the rapid level change in the output signal Vo. From the point of view of the floating control logic 2 the potential V1 is measured with respect to the output signal Vo, i.e., only the potential difference V1–Vo is relevant. Due to the edge in the output signal Vo the potential difference V1–Vo (i.e., the potential V1 with respect to output signal Vo) shows a negative spike as it is illustrated in the third timing diagram of FIG. 3. This negative spike can be detected by the floating comparator 25'. The potential difference V1–Vo is compared with a reference voltage Vref and the output signal Vc of the comparator 25' is switched from a first logic level to a second logic level (i.e., from a low level to a high level) as long as the difference V1–Vo is below the reference voltage Vref. Thus, a rising edge in the output signal Vo is signalled by a short pulse in the output signal Vc of the comparator 25'.

The delay time elapsing from the occurrence of a rising edge in the input signal PWM and the start of the pulse in the comparator output signal Vc of the comparator 25' is labelled t1, the width of the pulse is labelled t2. As it will be shown later, the pulse width t2 has to be just as long as it is necessary to trigger a latch. The delay time t1 depends mainly on the slope of the edge in the output signal Vo and on the value of the reference voltage. The pulse width t2 depends on the values of capacitor C1 and resistor R1.

Figure 4A:
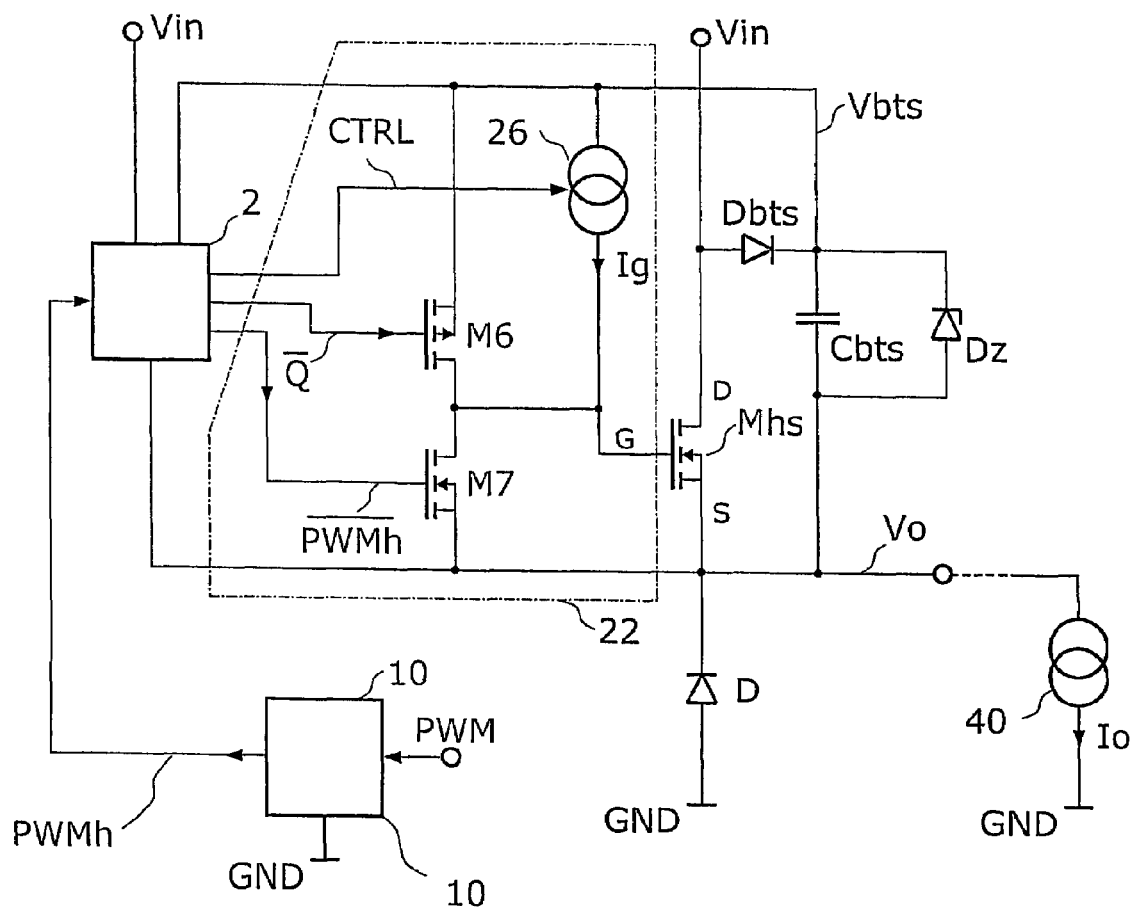
FIG. 4a corresponds to FIG. 2, the floating driver circuit being illustrated in more detail.
Figure 4B:
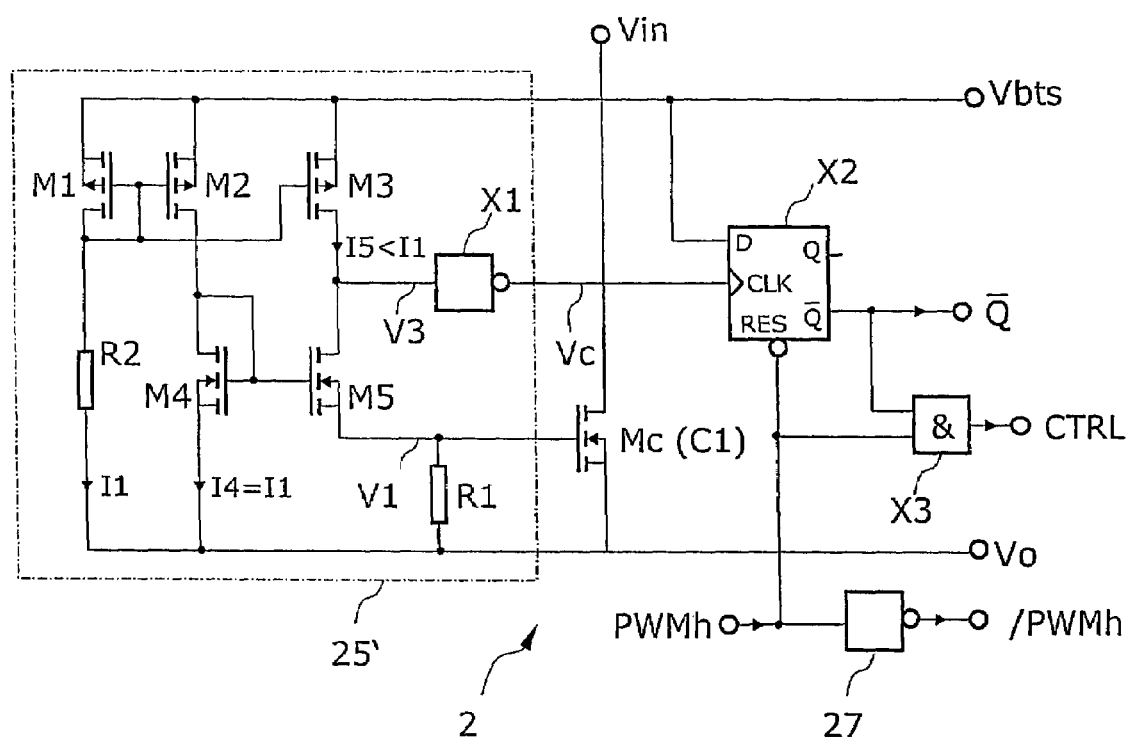
FIG. 4b shows the floating control logic of the circuit arrangement shown in FIG. 4a in more detail.

FIG. 4a shows one possible embodiment of the floating driver circuit 22 in more detail. FIG. 4b shows one possible embodiment of the floating control logic 2, i.e., the edge detection and the means 21 for generating the control signals CTRL and Q.

The floating driver circuit 22 shown in FIG. 4a is designed to control the gate charge of the high-side semiconductor switch MHS by charging the gate G with a constant current Ig until an edge in the output signal Vo is detected.

The floating driver circuit 22 comprises a controllable current source 26 connected between the gate terminal G of the high-side switch Mhs and the third supply terminal providing the bootstrap supply voltage Vbts. The current source 26 can be switched on and off by a first control signal CTRL from the floating control logic 2. The floating driver circuit 22 further comprises a p-MOSFET M6 and an n-MOSFET M7 which both have their drain terminals connected to the gate terminal G of the semiconductor switch Mhs. The p-MOSFET M6 has its source terminal connected to the third supply terminal (providing Vbts) and the n-MOSFET M7 has its source terminal connected to the output terminal (providing Vo). As can easily be seen in FIG. 4a the gate-source path of the semiconductor switch Mhs can be shorted with the n-MOSFET M7, thus switching off the semiconductor switch Mhs. The p-MOSFET is able to switch on the semiconductor switch Mhs by connecting the gate terminal of the high-side switch Mhs with the bootstrap supply voltage Vbts. The gate of the p-MOSFET M6 receives a second control signal /Q (meaning "not Q"), the gate of the n-MOSFET M7 receives the inverted floating input signal /PWMh (meaning "not PWMh") provided by the inverter 27 (cf. FIG. 4b).

A low level of the input signal PWM (and therefore a low level in the floating input signal PWMh) signals the floating driver circuit 22 to switch off the high-side switch Mhs. This is done by the floating control logic 2 which also provides an inverted input signal /PWMh to the gate of the n-MOSFET M7, thus switching off the high-side switch Mhs by switching on the n-MOSFET M7 and pulling the gate potential of the high-side switch Mhs close to its source potential. In this state the control signal CTRL deactivates the current source 26 and the second control signal /Q is at a high level, thus switching off the p-MOSFET M6. When the level of the input signal PWM changes to a high level signalling that the semiconductor switch Mhs has to be switched on, the n-MOSFET M7 is switched to an off-state by the inverted input signal /PWMh and the control signal CTRL activates the current source 26, thus providing a constant current Ig to the gate terminal G of the high-side switch Mhs. Consequently, the gate of the high-side switch Mhs is charged until its gate-source voltage reaches the threshold voltage and the high-side switch Mhs starts to conduct. During this charging process the output current $I_o$ (symbolized by the current source 40) flows partly through the freewheeling diode D and partly through the transistor Mhs.

When the current iM through the transistor Mhs reaches the value of the output current Io, then the current through the freewheeling diode D becomes zero, the level of the output signal Vo starts to rise, and a rising edge is detected by the floating control logic 2 as explained above. The detection of the edge is signalled by the second control signal /Q. The n-MOSFET M6 is switched on by the second control signal /Q, thus connecting the gate terminal of the high-side semiconductor switch Mhs with the bootstrap supply voltage Vbts. During this low-ohmic state of the high-side semiconductor switch Mhs the gate-source voltage of the semiconductor switch Mhs is approximately equal to the bootstrap supply voltage Vbts. The current source 26 is deactivated by the first control signal CTRL after the edge in the output signal Vo has been detected.

A falling edge in the input signal PWM resets the floating driver circuit 22, i.e., p-MOSFET M6 is switched off and n-MOSFET M7 is switched on again, thus switching the high-side semiconductor switch MHS again to an off-state.

To summarize the above, the three states which this embodiment of the floating driver circuit can assume are shown in the table below.

| first state | PWM = low, /PWMh = high, /Q = high, CTRL = low | M7 = on, M6 = off, Ig = 0, Mhs = off |
|---|---|---|
| second state | PWM = high, /PWMh = low, /Q = high, CTRL = high | M7 = off, M6 = off, Ig = constant, Mhs = high resistance (saturation zone) |

-continued

| third state | PWM = high, /PWMh = low, /Q = low, CTRL = low | M7 = off, M6 = on, Ig = 0, MHS = on(triode zone) |
| --- | --- | --- |

In the first state the input signal PWM has a low level, therefore the inverted floating input signal /PWMH has a high level, thus switching n-MOSFET M7 into an on-state. The first control signal CTRL has a low level, thus deactivating the current source 26 and the second control signal /Q has a high level, thus switching off p-MOSFET M6.

A level change in the input signal PWM puts the floating driver circuit 22 into its second state. Then the input signal PWM has a high level, the inverted floating input signal /PWMH consequently a low level, thus switching n-MOSFET M7 off. The first control signal CTRL has a high level for switching on the current source 26 providing a constant gate current Ig to the high-side switch Mhs. The second control signal /Q remains in a high level and therefore p-MOSFET M6 remains in an off-state. The second state lasts until a rising edge in the output signal Vo is detected.

The detection of the rising edge puts the floating driver circuit 22 into its third state. The input signal PWM is unchanged at a high level. The first control signal CTRL changes to a low level thus switching off the current source 26 again and the second control signal /Q changes to a low level thus switching n-MOSFET M6 into an on-state and consequently the high-side semiconductor switch Mhs into an on-state with a low on-resistance (Ron).

In FIG. 4b the floating control logic 2 including the edge detection and the generation of the control signal CTRL and /Q is illustrated in more detail.

In the embodiment of the floating control logic shown in FIG. 4b the transistors M1 to M5 and reference resistor R2 assume the function of the comparator 25' and the reference voltage source Vref of FIG. 2. The first transistor M1 (p-MOSFET) is connected in series with the resistor R2 between the third supply terminal (providing Vbts) and the output terminal (providing Vo). The drain current of transistor M1 also flows through reference resistor R2 is labelled I1. The second transistor M2 and the fourth transistor M4 are also connected in series between the third supply terminal and the output terminal. The first transistor M1 and the second transistor M2 have their gates connected together and also connected to the drain of the first transistor M1, thus forming a current mirror. That is the drain current I4 of the second transistor M2 and the fourth transistor M4 is equal to the drain current I1 of the first transistor M1. The third transistor M3 and the fifth transistor M5 are connected in series between the third supply terminal and a first terminal of resistor R1. The second terminal of resistor R1 is again connected to the output terminal. The gate of the third transistor M3 is also connected to the gates of the first and the second transistor M1 and M2. That is the first transistor M1 and the third transistor M3 also form a current mirror as well as transistors M4 and M5, whose gates are also both connected with the drain terminal of the fourth transistor M4. The transistors M1 to M3 have all the same active area. The fourth transistor M4 has a larger area than the fifth transistor M5. Consequently the common drain current I5 of the third transistor M3 and the fifth transistor M5 is determined by the fifth transistor M5 and since the active area of M5 is smaller than the active area of transistor M4 the drain current of the fifth transistor M5 is lower than the drain current of the first and the second transistor M1 and M2.

Since the product R1×I5 is small, the voltage drop V1−Vo over resistor R1 will close to zero in steady state and the potential V3 of the common drain terminal of the third transistor M3 and the fifth transistor M5 will assume a high level, the third transistor M3 operating in its linear region and the fifth transistor M5 in its saturation region. The drain potential of the transistors M3 and M5 is received by the inverter X1 which can be seen as the output signal of the comparator 25' made up of transistors M1 to M5, reference resistor R2 and inverter X1. As already explained in steady state the voltage drop over resistor R1 is zero, the drain potential V3 of transistors M3 and M5 assume a high level and, consequently, the output voltage Vc of the inverter X1 assumes a low level.

In the current embodiment the n-MOSFET Mc takes over the role of capacitor C1 of FIG. 2. The drain-gate capacitance of MOSFET Mc is charged, while the output signal Vo is in a low level. Therefore the drain of the MOSFET Mc is connected to the first supply terminal (Vin) and its source is connected to the output terminal (Vo) and its gate terminal is connected to the first terminal of resistor R1 and to the source terminal of the fifth transistor M5. As already explained with FIG. 3 a rising edge in the output signal Vo results in a negative spike of the potential V1 of the common node of resistor R1 and capacitor C1 (which is here formed by the drain-gate capacitance of MOSFET Mc). Since the voltage drop over the fifth transistor M5 will not change the negative spike can also be observed in the drain potential V3 of third transistor M3 and the fifth transistor M5, thus resulting in a low level of potential V3 and, consequently, a high level in the output signal Vc of the inverter X1. As a result, the rising edge in the output signal Vo is signalled by a pulse in the output signal Vc of the inverter X1.

In this embodiment the reference voltage Vref can be seen as the difference between the gate-source voltages of the fourth transistor M4 and the fifth transistor M5, if both transistors M4 and M5 would be in saturation with the same current ($I_4=I_5$).

Finally, the first control signal CTRL and the second control signal /Q are generated by an edge triggered D-latch X2 and an AND-gate X3. The D-input of the D-latch X2 is connected with the third supply terminal (Vbts), the clock-input of the D-latch receives the output signal Vc of the inverter X1, the reset-input of the D-latch is connected to the floating input signal PWMh. The non inverting output Q is not used, the inverting output /Q is provided to the floating driver circuit 22 and to the AND-gate X3 which provides the first control signal CTRL as an output signal. The floating input signal PWMh serves also as a second input signal to the AND-gate X3. A low level in the floating input signal PWMh resets the D-latch X2. The first control signal CTRL is also set to a low level by the AND-gate X3 and the second control signal /Q is set to a high level as a result of the reset of the D-latch X2. When the floating input signal PWMh switches to a high level the first control signal CTRL, as a consequence, also switches to a high level, whereas the second control signal /Q does not change its state. As mentioned before the first control signal CTRL activates the current source for charging the gate of the high-side semiconductor switch.

A rising edge in the output signal Vo is signalled by a short pulse in the output signal Vc of the inverter X1 which is received by the clock-input of the D-latch X2. As a consequence, the inverted output /Q of the D-latch switches to a low level. So does the first control signal CTRL which is the result of an AND-conjunction of the inverted output /Q of the D-latch and the floating input signal PWMH. The effect of the control signals has been explained in detail with FIG. 4a. The D-latch X2 is reset with the next low level of the floating input signal PWMH.

Figure 5:
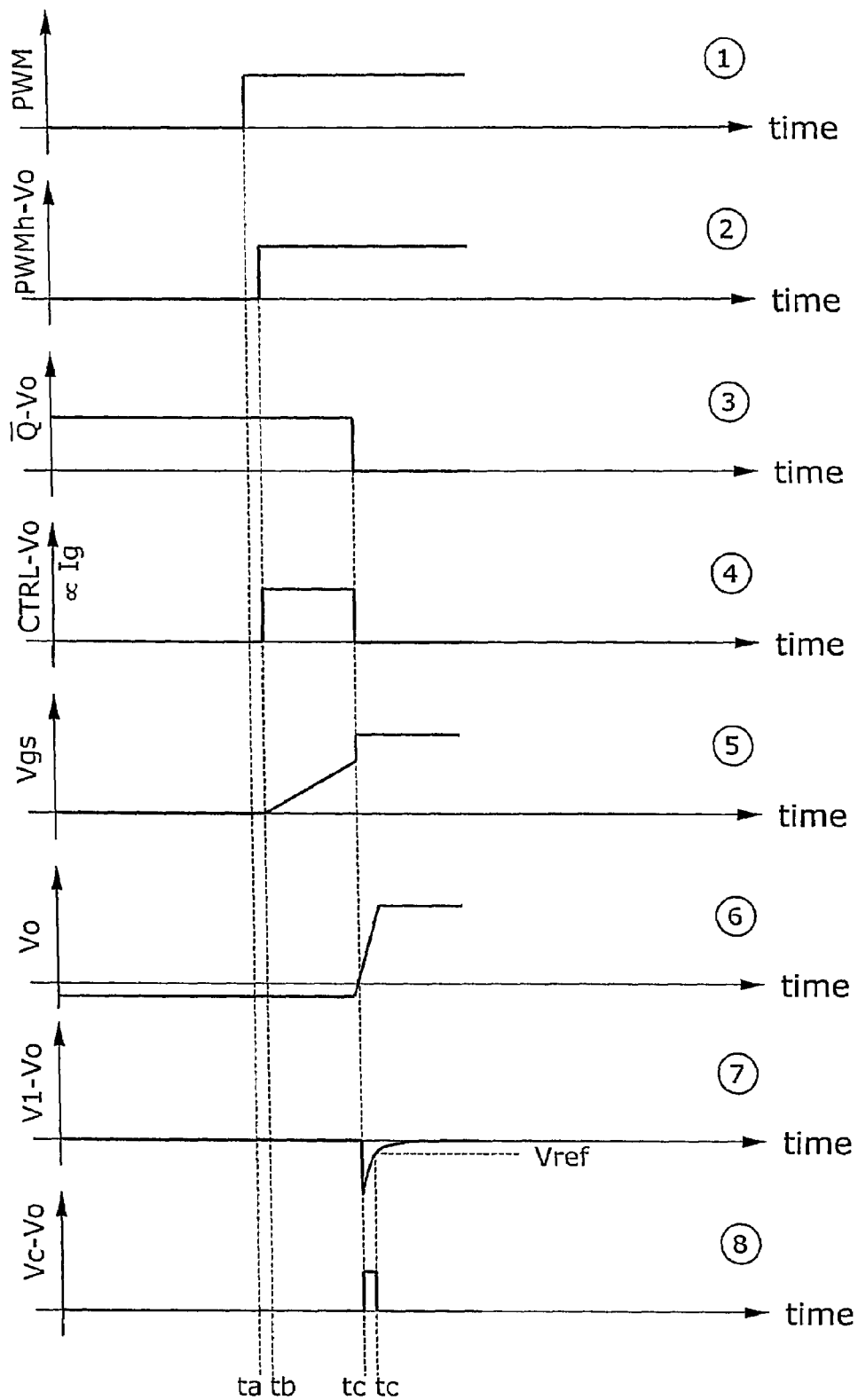
FIG. 5 shows timing diagrams of several signals within the floating control logic shown in FIG. 4b.

FIG. 5 illustrates the function of the floating control logic 2 of FIG. 4b with the help of timing diagrams. Like in FIG. 3 all (floating) signals except the input signal PWM and the output signal Vo, which are related to ground potential GND, are measured with respect to the output signal, i.e. the differences PWMh–Vo, /Q–Vo, CTRL–Vo, Vc–Vo, V1–Vo, etc. are displayed instead of absolute values.

The first timing diagram in FIG. 5 shows a rising edge at a time ta in the input signal PWM. The second timing diagram illustrates the level-shifted floating input signal PWMh, which is delayed with respect to the input signal by a delay time tb-ta. At the time tb the edge in the floating input signal PWMh triggers the AND-gate X3 (cf. FIG. 4b) and the first control signal CTRL changes to a high level, activates the current source 26 charging the gate of the high-side switch Mhs with a gate current Ig. The first control signal and the gate current Ig are illustrated in the fourth timing diagram.

Due to the drain current Ig the gate-source voltage Vgs of the high-side switch Mhs increases until it reaches a voltage that allows the current iM through the high-side switch Mhs (cf. fifth timing diagram of FIG. 5) to reach the value of the output current Io. As a result the output voltage V0 rises from a slightly negative value (due to the voltage drop on the free-wheeling diode D) to a value close to Vin. The output voltage V0 is shown in the sixth timing diagram.

As already explained with FIG. 3, the voltage drop over resistor R1 exhibits a negative spike (cf. seventh timing diagram of FIG. 5) which is detected by the comparator 25' and signalled by a short pulse in the comparator output signal Vc (cf. eighth timing diagram of FIG. 5).

As a consequence, the first control signal CTRL is reset to a low level, thus deactivating the current source 26 (cf. fourth timing diagram of FIG. 5). The second control signal /Q is set to a low level, thus pushing the gate-source voltage Vgs of the high-side switch Mhs up to the bootstrap supply voltage Vbts and switching the high-side switch Mhs into a low-ohmic state (cf. fifth timing diagram of FIG. 5).

Figure 6:
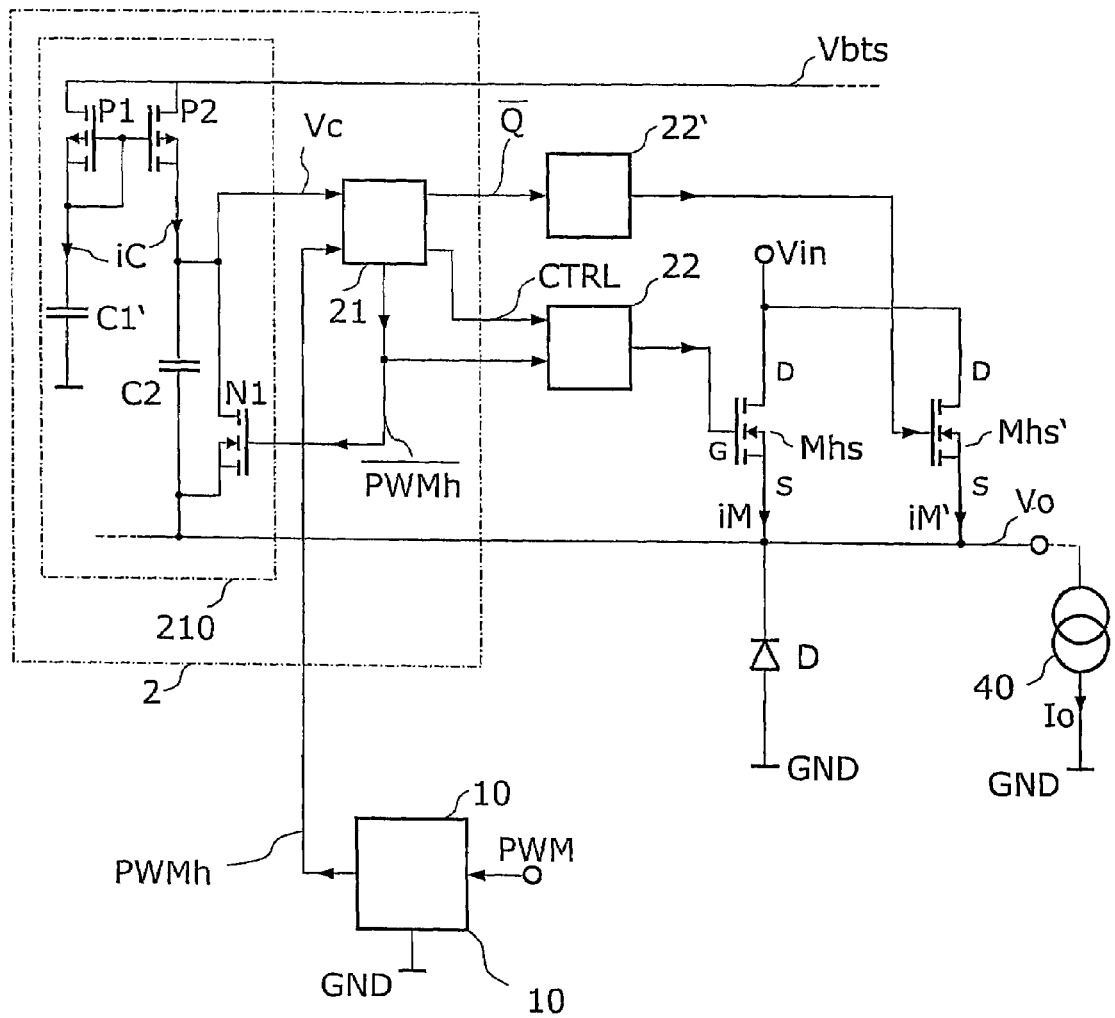
FIG. 6 shows another embodiment of the invention comprising a further high-side semiconductor switch connected in parallel to the high-side semiconductor switch.

FIG. 6 shows another embodiment of the invention which comprises a further high side semiconductor switch Mhs'. The drain-source-path of the further high-side semiconductor switch Mhs' is connected in parallel to the drain-source-path of the first high-side semiconductor switch Mhs. A further floating driver circuit 22' is provided to control the gate of the further high-side semiconductor switch Mhs'. The control signals (Q, CTRL, /PWMh) for the floating driver circuits 22, 22' are provided by the floating logic 2.

This embodiment with two semiconductor switches allows using a small transistor Mhs to control accurately the current shape and a larger semiconductor switch to provide a low on-resistance Ron.

In the following another implementation of the floating control logic 2 is described. This implementation is an alternative to the floating control logic 2 shown in FIG. 4b. Both implementations of the floating control logic 2 fulfil the same function and are interchangeable, wherein the implementation shown in FIG. 4b needs only one capacitor (realized by the Miller-capacitance of MOSFET Mc), whereas the implementation shown in FIG. 6 needs two capacitors which can increase the necessary chip size when implementing the circuit arrangement in a single chip.

Like in other embodiments the floating control logic 2 comprises means 210 (P1, P2, C1', C2, N1) for detecting an edge in the output signal and means 210 for generating the control signals CTRL, Q, /PWMh dependent on the result of the edge detection. The means 210 for detecting an edge in the output signal Vo comprises a current mirror formed by a first transistor P1 and a second transistor P2 each having a first load terminal, a second load terminal and a control terminal. The first load terminals both are connected with the third supply terminal providing the bootstrap supply voltage Vbts, and the control terminals both are connected to the second load terminal of the first transistor P1, such that transistors P1 and P2 form a current mirror copying the load current of the first transistor P1 to the second transistor P2. The second load terminal of the first transistor P1 is connected to a constant potential, e.g. ground potential, via a first capacitor C1'. The second load terminal of the second transistor P2 is connected with the output terminal via a second capacitor C2. A third transistor (e.g. an n-MOSFET) is connected in parallel to the second capacitor C2, such that capacitor C2 can be shorted and discharged by a third transistor N1 in response to an adequate logic level at the control terminal of the third transistor N1.

In the case shown in FIG. 6 the control terminal (gate) of the third transistor N1 receives an inverted version /PWMh of the input signal PWMh provided by the means 21 for generating the control signals. The potential of the second load terminal of the second transistor P2 serves as an input Vc for the means 21 for generating the control signals. The logic level of the signal Vc indicates the switching state of the high side switches Mhs, Mhs' and its function is equivalent to the function of the output signal Vc of the comparator 25' shown in FIG. 2.

Figure 7:
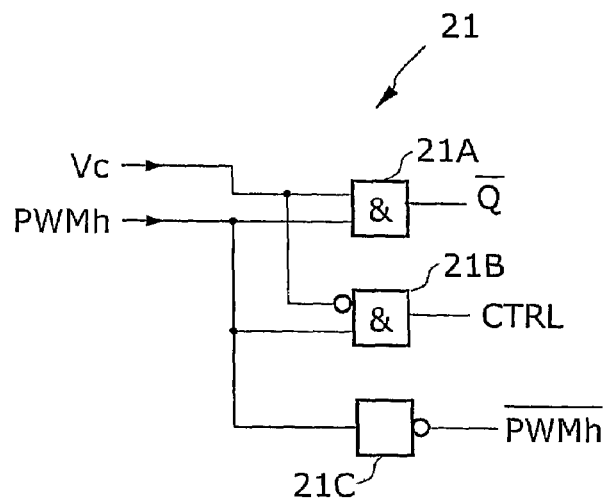
FIG. 7 shows an example of a possible implementation of the means for generating the control signals.

One possible implementation of the means 21 for generating the control signals is shown in FIG. 7. The logic circuit 21 receives the level shifted input signal PWMh and the signal Vc indicating, that an edge in the output signal Vo is detected. Both of these signals are received by a first AND-gate 21A and by a second AND-gate 21B, wherein the first AND-gate 21A has two non-inverting inputs ant the second AND-gate 21B inverts one input signal, namely the signal Vc. The output of the second AND-gate 21B is the first control signal CTRL received by the floating driver circuit 22, the output of the first AND-gate 21A is the second control signal Q received by the further floating driver circuit 22'. An inverter 21C receives the level shifted input signal PWMh and provides an inverted version /PWMh thereof which is also received by the floating driver circuit 22.

The floating driver circuit 22 can be similar to the driver shown in FIG. 4a, wherein the p-MOSFET M6 is not needed (cf. FIG. 4a). The further floating driver 22' is adapted to transfer the second control signal Q to the gate of the further semiconductor switch Mhs', wherein the slopes of the edges of the second control signal Q can be limited.

The function of the floating control logic including the means 210 for detecting an edge in the output signal Vo is explained with reference to the timing diagrams depicted in FIG. 8. To understand the function of the implementation of FIGS. 6 and 7 first assume the output signal Vo (cf. diagram nr. 2 in FIG. 8) and the input signal PWM (cf. diagram nr. 1 in FIG. 8) being at a low level. Capacitor C2 (voltage drop Vc–Vo, cf. diagram nr. 4 in FIG. 8) has been discharged through the third transistor N1 and the first capacitor C1' (voltage drop V1, cf. diagram nr. 3 in FIG. 8) has been charged to a voltage level proximately equal to bootstrap supply voltage Vbts. Both high-side semiconductor switches Mhs, Mhs' are in an off-state.

As a response to a rising edge in the input signal PWM (and also in the level shifted input signal PWMh) at a time tA the output (first control signal CTRL) of the second AND-gate 21B changes to a high level which is transferred to the floating driver circuit 22 which initiates the charging of the gate of the high-side semiconductor switch Mhs. At this point the further high-side semiconductor switch Mhs' still remains in an off-state. When the current iM through the semiconductor switch Mhs reaches the value of the output current Io, the potential of the output signal Vo rises from a low level close to ground to a higher level (Vin−Ron(Mhs)×I0, i.e. input voltage Vin minus the voltage drop Ron(Mhs)×I0 across the on resistance Ron) and the bootstrap supply voltage Vbts also increases with respect to ground potential by the same amount as the output signal Vo. The rising edge (with respect to ground potential, not with respect to the output signal Vo) in the bootstrap supply voltage Vbts causes the first capacitor C1' to charge via the first transistor P1. The current iC charging the capacitor C1' is "copied" to the second transistor P2, since the transistors P1 and P2 form a current mirror. As a consequence capacitor C2 is also charged, the voltage drop Vc−Vo over the capacitor C2 (cf. diagram nr. 4 of FIG. 8) increases and signals a rising edge to the means 21 for generating the control signal. During this phase the third transistor N1 is in an off-state and can not discharge capacitor C2, since its gate potential (determined by the logic level of the inverted input signal /PWMh) is low. The sum of the current iM through of the semiconductor switch Mhs and of the current iM' through of the further semiconductor switch Mhs' is shown in diagram nr. 3 of FIG. 8).

Figure 8:
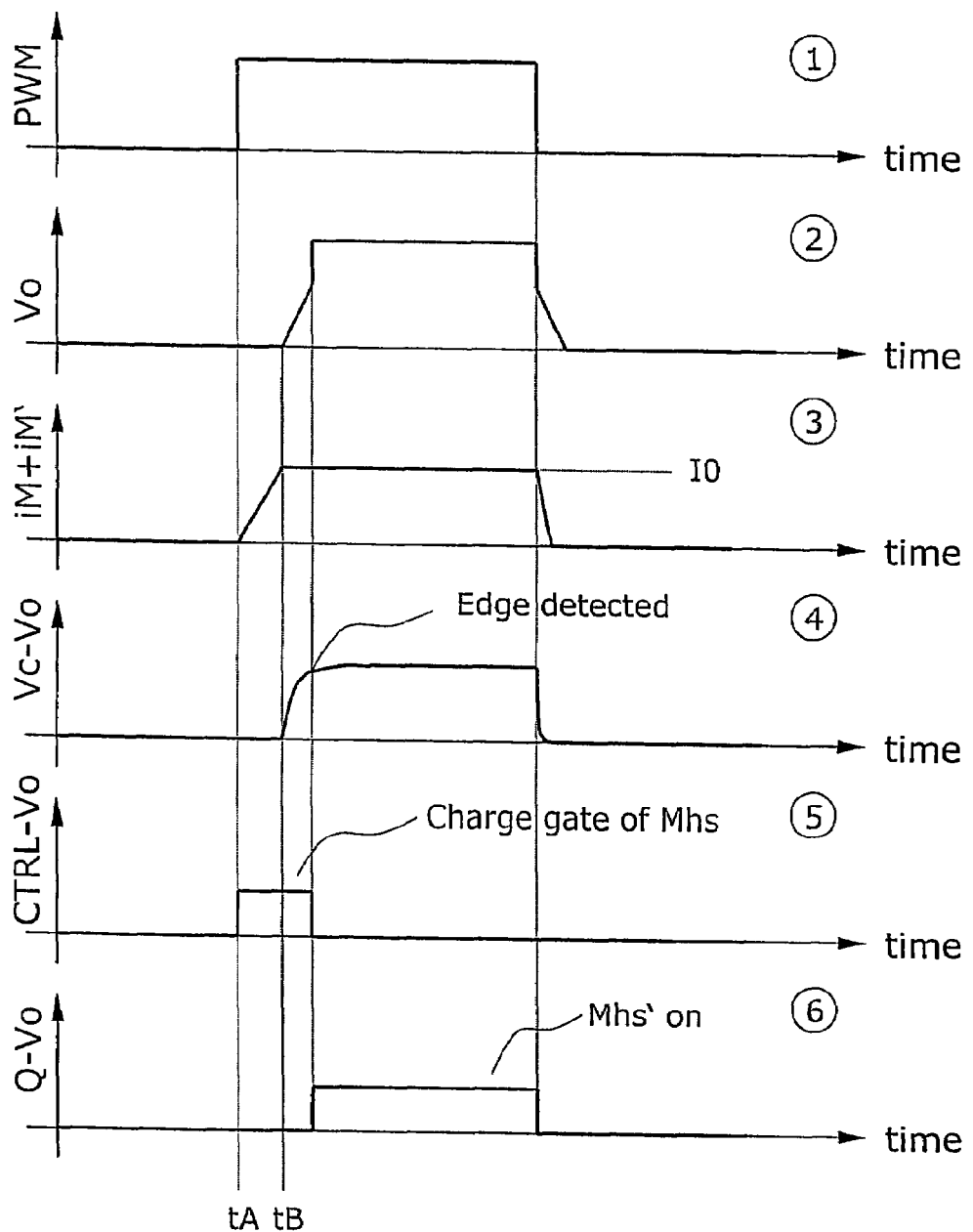
FIG. 8 shows timing diagrams of signals in the circuit arrangement of FIGS. 6 and 7

As a response to the detection of the rising edge the second control signal Q switches the further semiconductor switch Mhs' into an low resistance on-state (cf. diagram nr 6 in FIG. 8).

When the level shifted input signal PWMh goes back to a low level, the further semiconductor switch Mhs' is switched off, the gate of the semiconductor switch Mhs is discharged (discharging triggered by the inverted input signal /PWMh) and capacitor C2 is also discharged through the third transistor N1 which is switched on by the inverted input signal /PWMh.

What is claimed is:

1. A circuit arrangement comprising:
   a high-side semiconductor switch including a first load terminal connected to a first supply terminal configured to receive an input voltage, a second load terminal connected to an output terminal configured to provide an output signal, and a control terminal;
   a floating driver circuit connected to the control terminal for driving the semiconductor switch;
   a level shifter configured to receive an input signal and provide a floating input signal dependent on the input signal; and
   a floating control logic configured to receive the output signal and the floating input signal and provide at least one control signal to the floating driver circuit, the floating control logic comprising means for detecting an edge in the output signal and means for generating the at least one control signal dependent on the result of the edge detection.

2. The circuit arrangement of claim 1, wherein the means for detecting an edge in the output signal comprise,
   a series circuit including a capacitor and a resistor connected between the first supply terminal and the output terminal,
   a comparator including a first input terminal connected with a common node of the capacitor and the resistor, the comparator connected to the means for generating the at least one control signal, and
   a reference voltage source connected between a second input terminal of the comparator and the output terminal.

3. The circuit arrangement of claim 1, wherein the floating driver circuit is adapted to provide a constant current to the control terminal of the semiconductor switch before an edge in the output signal is detected.

4. The circuit arrangement of claim 3, wherein the floating driver circuit is adapted to provide a constant potential to the control terminal of the semiconductor switch after an edge in the output signal is detected.

5. The circuit arrangement of claim 1, further comprising
   a further high-side semiconductor switch including a first load terminal connected to the first supply terminal, a second load terminal connected to the output terminal, and a control terminal; and
   a further floating driver circuit connected to the control terminal of the further high-side semiconductor switch for driving the further high-side semiconductor switch;
   wherein the floating control logic is adapted to provide at least one control signal to each of the floating driver circuit and the further floating driver circuit.

6. The circuit arrangement of claim 1, wherein the floating control logic is adapted to signal the result of the edge detection to the floating driver circuit via the control signal.

7. The circuit arrangement of claim 1, further comprising a bootstrap circuit connected to the output terminal and configured to provide a bootstrap supply voltage at a third supply terminal.

8. The circuit arrangement of claim 7, wherein each of the floating driver circuit and the floating control logic is supplied by the output signal and the bootstrap supply voltage.

9. The circuit arrangement of claim 7, wherein the means for detecting an edge in the output signal comprise
   a current mirror including a first transistor and a second transistor each having a first load terminal, a second load terminal and a control terminal, wherein the first load terminals both are connected with the third supply terminal, and wherein the control terminals both are connected to the second load terminal of the first transistor,
   a first capacitor connecting the second load terminal of the first transistor and a constant potential, and
   a second capacitor connecting the second load terminal of the second transistor and the output terminal,
   wherein the second load terminal of the second transistor is connected to the means for generating the control signal.

10. The circuit arrangement of claim 5, wherein the floating driver circuit is adapted to provide a constant current to the control terminal of the semiconductor switch before an edge in the output signal is detected.

11. The circuit arrangement of claim 10, wherein the further floating driver circuit is adapted to provide a constant potential to the control terminal of the further high-side semiconductor switch after an edge in the output signal is detected.

12. A circuit arrangement comprising:
   a high-side semiconductor switch including a first load terminal configured to receive an input voltage, a second load terminal connected to an output node configured to provide an output signal, and a control terminal;
   a floating driver circuit connected to the control terminal;
   a level shifter configured to receive an input signal and provide a floating input signal dependent on the input signal received by the level shifter; and
   a floating control logic configured to receive the output signal and the floating input signal, the floating control logic comprising an edge detector configured to detect an edge in the output signal, the floating control logic further comprising a control signal generator configured to provide a control signal to the floating driver circuit, wherein the control signal is dependent on an edge detection from the edge detector.

13. The circuit arrangement of claim 12, wherein the edge detector comprises
   a series circuit including a capacitor and a resistor,
   a comparator including a first input terminal connected with a common node of the capacitor and the resistor, the comparator connected to the control signal generator, and
   a reference voltage source connected between a second input terminal of the comparator and the output node.

14. The circuit arrangement of claim 12, wherein the floating driver circuit is adapted to provide a constant current before an edge in the output signal is detected by the edge detector.

15. The circuit arrangement of claim 14, wherein the floating driver circuit is adapted to provide a constant potential after an edge in the output signal is detected by the edge detector.

16. The circuit arrangement of claim 12, further comprising
   a further high-side semiconductor switch with a first load terminal configured to receive the input voltage, a second load terminal connected to the output terminal, and a control terminal, and
   a further floating driver circuit connected to the control terminal of the further high-side semiconductor switch;
   wherein the floating control logic is configured to provide at least one control signal to each of the floating driver circuit and the further floating driver circuit.

17. The circuit arrangement of claim 12, further comprising a bootstrap circuit connected to the output node and configured to provide a bootstrap supply voltage at an additional supply node.

18. The circuit arrangement of claim 17, wherein each of the floating driver circuit and the floating control logic is supplied by the output signal and the bootstrap supply voltage.

19. The circuit arrangement of claim 17, wherein the edge detector comprises
   a current mirror including a first transistor and a second transistor each having a first load terminal, a second load terminal and a control terminal, wherein the first load terminals both are connected with the additional supply node, and wherein the control terminals both are connected to the second load terminal of the first transistor,
   a first capacitor connecting the second load terminal of the first transistor and a constant potential, and
   a second capacitor connecting the second load terminal of the second transistor and the output node,
   wherein the second load terminal of the second transistor is connected to the control signal generator.

20. A method of operating a circuit arrangement comprising:
   providing a high-side semiconductor switch including a first load terminal connected to an input voltage at a first supply terminal, a second load terminal connected to an output terminal providing an output signal, and a control terminal;
   driving the semiconductor switch with a floating driver circuit connected to the control terminal of the semiconductor switch;
   receiving an input signal at a level shifter and providing a floating input signal dependent on the input signal;
   receiving the output signal and the floating input signal at a floating control logic;
   detecting an edge in the output signal at the floating control logic;
   generating at least one control signal dependent on the result of the edge detection; and
   providing the at least one control signal to the floating driver circuit.

\* \* \* \* \*